US006759632B2

(12) United States Patent
Ducret et al.

(10) Patent No.: US 6,759,632 B2
(45) Date of Patent: Jul. 6, 2004

(54) DEVICE FOR FAST AND UNIFORM HEATING SUBSTRATE WITH INFRARED RADIATION

(75) Inventors: René Pierre Ducret, Sassenage (FR); Franck Laporte, Bernin (FR); Benoit Pierret, Meylan (FR); Bachir Semmache, Noyen sur Sarthe (FR)

(73) Assignee: Joint Industrial Processors for Electronics, Noyen sur Sarthe (FR)

( * ) Notice: Subject to any disclaimer, the term of this patent is extended or adjusted under 35 U.S.C. 154(b) by 123 days.

(21) Appl. No.: 10/148,339
(22) PCT Filed: Oct. 12, 2001
(86) PCT No.: PCT/FR01/03171

§ 371 (c)(1),
(2), (4) Date: May 29, 2002

(87) PCT Pub. No.: WO02/31862

PCT Pub. Date: Apr. 18, 2002

(65) Prior Publication Data

US 2004/0052511 A1 Mar. 18, 2004

(51) Int. Cl.[7] .................................................. F27B 5/14
(52) U.S. Cl. ....................... 219/390; 219/405; 219/411; 392/408; 392/411; 392/4.9; 250/504 R; 250/495.1
(58) Field of Search ................................. 219/390, 405, 219/411; 118/724, 725, 50.1; 392/408, 411, 419–420, 422, 423; 250/504 R, 495.1

(56) References Cited

U.S. PATENT DOCUMENTS

| 5,444,814 A | * | 8/1995 | Hofius, Sr. .................. 392/407 |
| 5,740,314 A | * | 4/1998 | Grimm ....................... 392/420 |
| 5,790,751 A | | 8/1998 | Gronet et al. |
| 5,951,896 A | * | 9/1999 | Mahawili .................... 219/411 |
| 6,108,491 A | | 8/2000 | Anderson |
| 6,465,761 B2 | * | 10/2002 | Stevens et al. ............. 219/411 |

FOREIGN PATENT DOCUMENTS

| WO | WO 00/30157 | 5/2000 |
| WO | WO 00/34986 | 6/2000 |

* cited by examiner

Primary Examiner—Shawntina Fuqua
(74) Attorney, Agent, or Firm—Oliff & Berridge, PLC

(57) ABSTRACT

A heating device infrared radiation lamps 24, 26 designed to perform rapid thermal processing of the substrate 12 inside a reaction chamber 14 with a transparent window 34. The infrared lamps 24, 26 are arranged in two superposed stages A, B extending on a single side of the substrate 12, the lamps 24 of the lower stage A being arranged perpendicularly with respect to the lamps 26 of the upper stage B. Adjusting the supply power by of lamps for greater heating on the edges than in the center of the substrate 12. A reflector 36 in the form of a distribution grid 38 is designed to reflect the infrared radiation to control the power ratios between the different heating zones. This results in uniform heating of the substrate 12 regardless of the geometry and dimensions thereof.

16 Claims, 4 Drawing Sheets

| zones | 1 | 2 | 3 | 3 | 2 | 1 |
|---|---|---|---|---|---|---|
| 4 | 6 | 5 | 4 | 4 | 5 | 6 |
| 5 | 5 | 4 | 3 | 3 | 4 | 5 |
| 6 | 4 | 3 | 2 | 2 | 3 | 4 |
| 6 | 4 | 3 | 2 | 2 | 3 | 4 |
| 5 | 5 | 4 | 3 | 3 | 4 | 5 |
| 4 | 6 | 5 | 4 | 4 | 5 | 6 |

DEVICE FOR FAST AND UNIFORM HEATING SUBSTRATE WITH INFRARED RADIATION

BACKGROUND OF THE INVENTION

The invention relates to a heating device of a substrate, comprising infrared radiation lamps designed to perform rapid thermal processing of the substrate inside a closed reaction chamber that comprises a transparent window wherethrough said infrared radiation passes.

STATE OF THE ART

Rapid thermal processing RTP and chemical vapour deposition RTCVD annealing processes generally make use of a furnace with infrared radiation generated by halogen lamps. The substrate, for example made of silicon in microelectronics product manufacturing technologies, is installed in a controlled atmosphere, in a closed enclosure, and the infrared radiation is directed onto the superficial face of the substrate through a transparent window.

The temperatures reached when the thermal processing operations are performed can be high, often over 1000° C., with temperature gradients liable to reach several 100° C./second. One of the important parameters of the processing is the uniformity of the temperature over the whole surface of the processed substrate, as the presence of thermal gradients of a few degrees centigrade between the central zone and the peripheral zone of the substrate can cause differences of quality on the substrate and/or homogeneity defects on the physical-chemical properties of the layers present at the substrate surface. The energy lost on the edges of the substrate is higher than for the center, which leads to a lower temperature at the edge than in the center.

To overcome these drawbacks in rapid thermal processes, it has already been proposed to compensate this temperature inequality by using the following known solutions:

a metal reflector positioned at the rear of the lamps,
heating of the two faces of the substrate with two sets of lamps arranged along the opposite sides of the reactor,
fitting a guard ring,
use of a susceptor,
rotating the substrate on a rotating plate,
association of two or more of the above solutions.

Implementation of these known solutions has not up to the present time enabled the light energy input at the surface of the substrate to be controlled perfectly according to the different thermal processing conditions used (annealing, growth, or thin layer deposition).

The document U.S. Pat. No. 5,790,751 describes a heating system with lamps arranged in vertical manner so that the lighting of ea&n lamp corresponds to a spot. The lamps are arranged in circular manner in a single assembly.

The document WO 00/34986 describes a quartz chamber that separates the lamps from the substrate.

The document U.S. Pat. No. 6,108,491 relates to spot lamps and not linear lamps. The spot lamps are arranged in circular manner under the substrate installed on a healing support (susceptor). The second series of lamps is arranged underneath, but over a smaller diameter to cover the central part of the heating support.

The document WO 00 30157 relates to two series of UV lamps with an arrangement on two fates of the reactor and an assembly at 90°.

OBJECT OF THE INVENTION

The object of the invention is to achieve a heating device with controlled and directional infrared radiation designed to perform uniform rapid thermal processing of substrates of different geometries and dimensions.

The device according to the invention is characterized in that:

the infrared lamps are arranged in two superposed stages extending on a single side of the substrate, the lamps of the lower stage being arranged perpendicularly with respect to the lamps of the upper stage, means for adjusting the supply power by groups of lamps achieve greater heating on the edges than in the centre of the substrate, and a reflector in the form of a distribution grid is designed to reflect and channel the infrared radiation to control the power ratios between the different heating zones.

According to a preferred embodiment, the distribution grid of the reflector is formed by a criss-cross arrangement of strips bounding a plurality of compartments of variable cross-sections assigned to the heating zones. The power distribution per zone of the two stages of halogen lamps and the presence of the intercalated reflector enable uniform heating of the substrate to be obtained regardless of the geometry and dimensions thereof.

According to one feature of the invention, the strips are criss-crossed at right angles and are made of a material having an optimum reflection index to reflect the infrared rays. The material of the lamps may be metallic (steel or aluminum) or non-metallic (ceramic, zircon).

The infrared radiation lamps are halogen lamps and each stage advantageously comprises the same number of tubular lamps staggered at regular intervals and extending parallel to one another.

The reflector can be fitted between the lower stage of the lamps and the window or be fitted directly between the lamp zones so as to cover the height of the two series of lamps.

BRIEF DESCRIPTION OF THE DRAWINGS

Other advantages and features will become more clearly apparent from the following description of an embodiment of the invention given as a non-restrictive example and illustrated in the accompanying drawings, in which.

DESCRIPTION OF A PREFERRED EMBODIMENT

Figure 1:
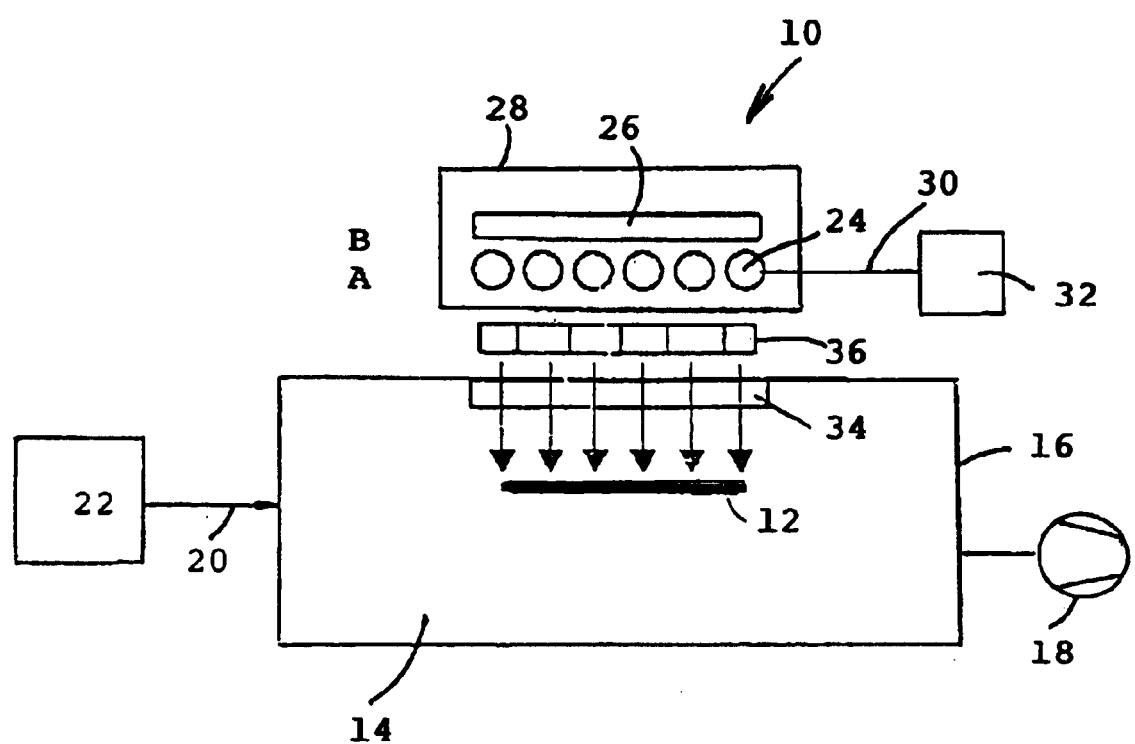
FIG. 1 is a schematic view of a reactor equipped with the heating device according to the invention.
Figures 2, 3:
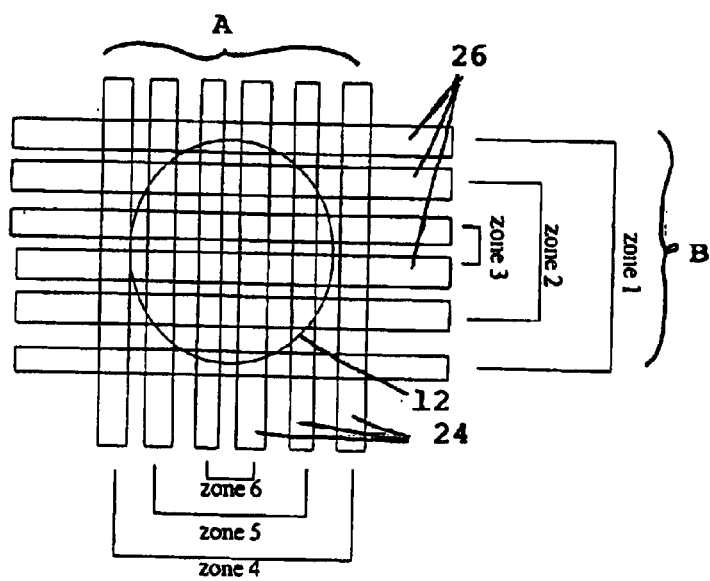
FIG. 2 shows a plan view of FIG. 1.
FIG. 3 represents the table of power distribution by heating zone.

In FIGS. 1 to 3, an infrared radiation heating device 10 is used in rapid thermal processes implemented in microelectronics substrate manufacturing technologies. Other applications are possible to produce micro-sensors and solar energy panels.

The substrate 12, for example made of silicon, is arranged in the middle zone of a reaction chamber 14 bounded by a closed enclosure 16 that is made of stainless steel or quartz. Pumping means 18 are connected to the enclosure 16 to work at atmospheric pressure or to reduce the internal pressure of the reaction chamber 14 down to secondary vacuums.

A neutral or reactive gas flow 20 can be input to the reaction chamber 14 by injection means 22 to perform processing operations in an inert or reactive atmosphere, in particular annealing of the substrate 12, deposition of thin layers on the exposed surface of the substrate 12 (chemical vapour deposition CVD technique), modification of the physico-chemical properties of the surface, etc.

According to the invention, the infrared radiation heating device 10 enables uniform rapid thermal processing of the whole exposed surface of the substrate 12 to be obtained. The heating device 10 is composed of two tubular halogen lamps 24, 26 arranged in two superposed stages A and B inside a housing 28. The first lower stage A comprises a plurality of halogen lamps 24, for example six in FIGS. 1 to 3, staggered at regular intervals and extending parallel to one another in a single plane. The second upper stage B is equipped with an identical number of lamps 26 arranged perpendicularly with respect to the lamps 24 of the first stage A and in a single plane parallel to the first plane.

The halogen lamps 24, 26 are supplied with power in groups being connected to an interconnection circuit 30 connected to an adjustable voltage power supply device 32 for adjustment of the electric power radiated in different heating zones. With reference to FIG. 2, the six lamps 26 of stage B are supplied according to three zones 1, 2, 3. For example, zone 1 is defined by the two end lamps 26, zone 2 by the two intermediate lamps 26, and zone 3 by the two juxtaposed internal lamps 26. In similar manner, the six lamps 24 of stage A are supplied according to three zones 4, 5, 6, orthogonal with respect to the zones 1, 2, 3. Zone 4 is bounded by the two end lamps 24, zone 5 by the two intermediate lamps 24, and zone 6 by the two internal lamps 24.

Adjustment of the power in each of the zones 1 to 6 enables the effects of radial thermal gradients linked to thermal losses by convection on the edges of the substrate 12 to be compensated. The power profile in the different zones determines the image of the temperature at the surface of the substrate 12. By applying a higher power on the peripheral zones than on the central zones, a uniform temperature profile is obtained over the whole substrate 12 following compensation of the thermal losses along the edges of the substrate 12. The structure illustrated in FIG. 2 enables a power distribution to be obtained as follows:

Power zone 1: 3
Power zone 2: 2
Power zone 3: 1
Power zone 4: 3
Power zone 5: 2
Power zone 6: 1 symbolised in the table of FIG. 3. It can be observed that the power distribution illustrated in this table thus enables greater heating to be achieved on the edges than in the centre of the substrate 12.

The enclosure 16 of the reaction chamber 14 is provided with a transparent window 34, for example made of quartz, that lets the infrared radiation emitted by the halogen lamps 24, 26 from outside the enclosure 16 pass through. In the gap situated between the heating device 10 and the window 34, there is arranged a reflector 36 designed to reflect the infrared radiation to control the power ratios between the different heating zones, given that the power required to compensate the thermal differences between the centre and the edges of the substrate 12 varies with the temperature of the substrate 12.

Figure 4:
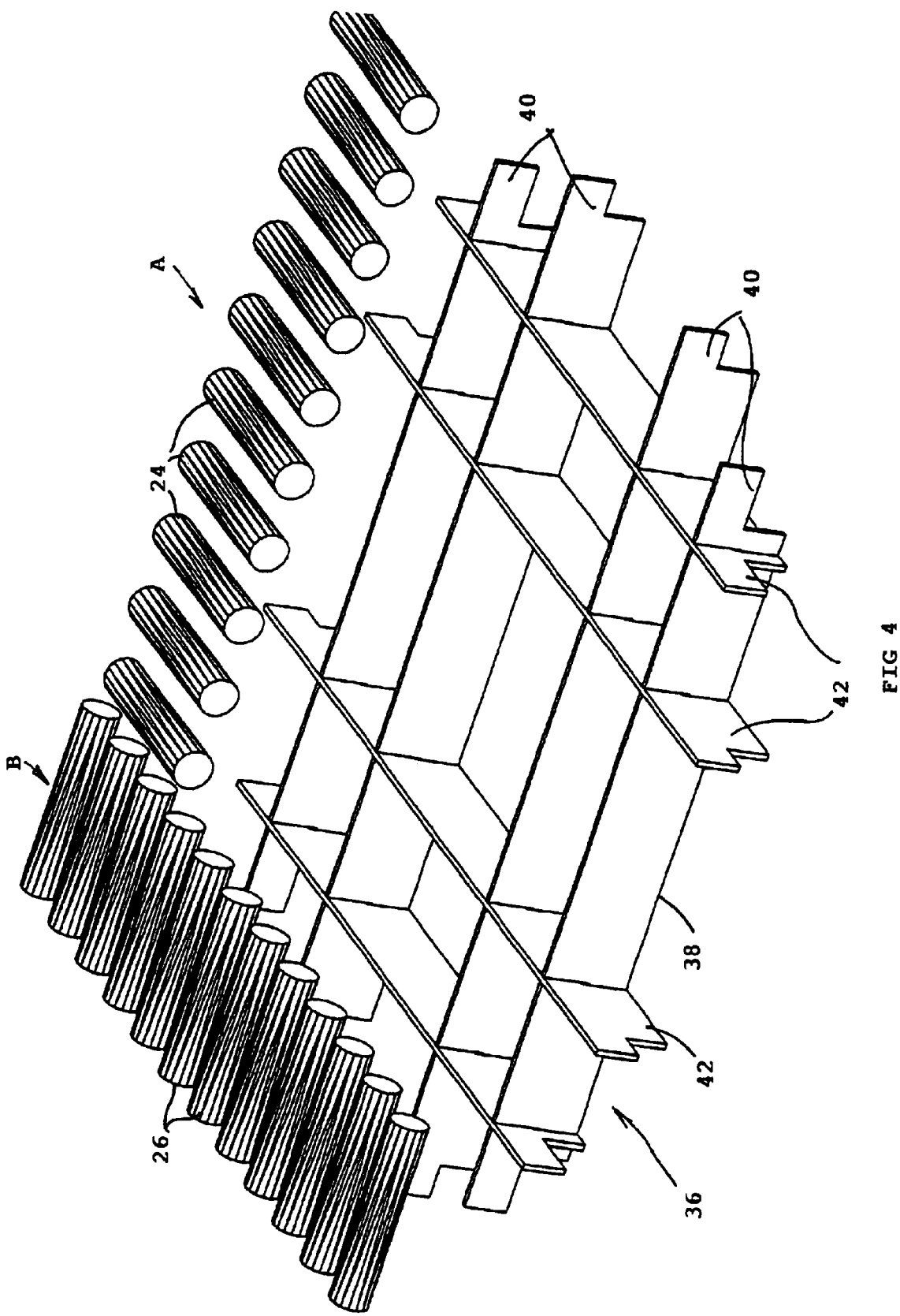
FIG. 4 illustrates a perspective view of the reflector associated to a heating device with twelve lamps per stage.

With reference to FIG. 4, each stage A and B comprises twelve lamps (two lamps 24 being hidden at the left of stage A). The reflector 36 arranged under the housing of the lamps 24, 26 is in the form of a distribution grid 38 formed by criss-crossing of four longitudinal strips 40 and four transverse strips 42 so as to define different quadrangular compartments open on the window 34 side and on the lamps 24, 26 side. The compartments present variable cross-sections assigned to each of the heating zones, thus enabling the light energy emitted by the different lighting zones of the lamps 24, 26 to be channeled to the corresponding zones of the substrate 12.

The criss-crossed strips 40, 42 of the reflector 36 are made of a material having an optimum reflection index to reflect the infrared rays. The material can be nonmetallic, for example ceramic or zircon-based. A grid made of metallic material can also be used, for example made of steel or aluminum, possibly with a superficial gold or silver coating.

In the case of a metallic material, the reflector 36 can advantageously be cooled by a cooling fluid.

Compensation by heating zones is thus controlled with precision, as the lighting zones of the substrate 12 are perfectly bounded by the reflector 36 to achieve maximum reduction of the effects of interferences between zones.

The power distribution by zones of the two stages of halogen lamps 24, 26 and the presence of the intercalated reflector 36 enable uniform heating of the substrate 12 to be achieved regardless of the geometry and dimensions thereof.

Figure 5:
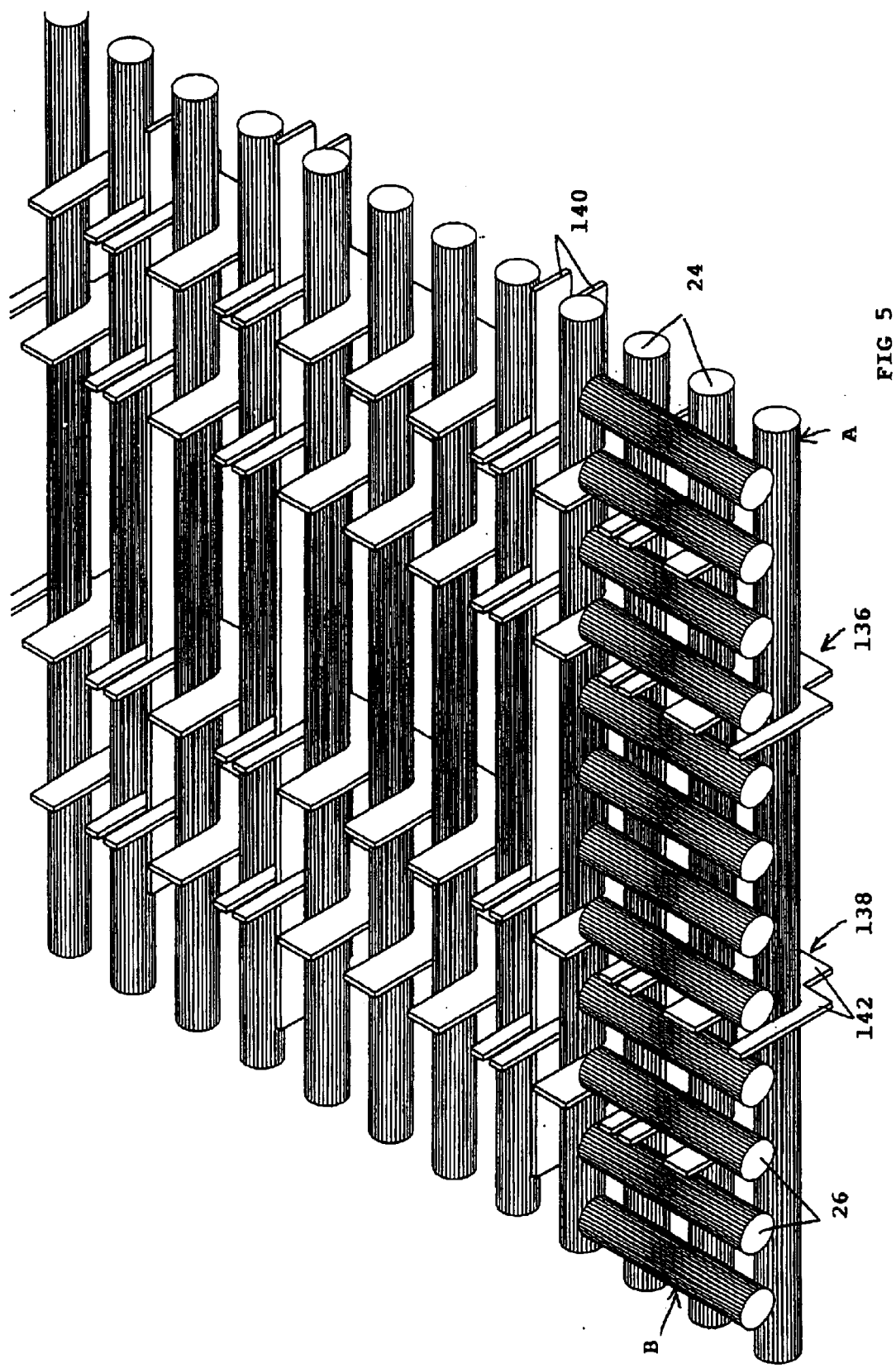
FIG. 5 is an identical view to FIG. 4 of an alternative embodiment.

According to the alternative embodiment of FIG. 5, the strips 142, 144 constituting the grid 138 of the reflector 136 are fitted between the lamps 24, 26 so as to cover the height of the two series A and B. This results in the zones of the lamps 24, 26 being completely framed within the shields.

What is claimed is:

1. A heating device of a substrate (12), comprising infrared radiation lamps (24, 26) designed to perform rapid thermal processing of the substrate inside a closed reaction chamber (14) that comprises a transparent window (34) wherethrough said infrared radiation passes, wherein:

the infrared lamps (24, 26) are arranged in two superposed stages (A, B) extending on a single side of the substrate (12), the lamps (24) of the lower stage (A) being arranged perpendicularly with respect to the lamps (26) of the upper stage (B), means for adjusting the supply power by groups of lamps (24, 26) ensure greater heating on the edges than in the centre of the substrate (1, 2), and a reflector (36, 136) in the form of a distribution grid (38, 138) is designed to reflect and channel the infrared radiation to control the power ratios between the different heating zones.

2. The heating device according to claim 1, wherein the distribution grid (38, 138) of the reflector (36, 136) is formed by a crisscross arrangement of strips (40, 42; 140, 142) bounding a plurality of compartments of variable cross-sections assigned to the heating zones, said grid being arranged either between the lamps (24, 26) and the window (34) or fitted between said lamps.

3. The heating device according to claim 2, wherein the strips (40, 42; 140, 142) are crisscrossed at right angles and are made of a material having an optimum reflection index to reflect the infrared rays.

4. The heating device according to claim 2, wherein the strips (40, 42; 140, 142) of the reflector (36, 136) are made of a non-metallic material, in particular ceramic or zircon-based.

5. The heating device according to claim 2, wherein the strips (40, 42; 140, 142) of the reflector (36, 136) are made of a metallic material, for example steel, aluminum, or a material having a superficial gold or silver coating.

6. The heating device according to claim 5, wherein the reflector (36, 136) is cooled by a cooling fluid.

7. The heating device according to claim 1, wherein the infrared lamps (24, 26) are halogen lamps.

8. The heating device according to claim 7, wherein each stage (A, B) comprises the same number of tubular lamps (24, 26) staggered at regular intervals and extending parallel to one another.

9. A reactor for rapid thermal processing equipped with a heating device according to claim 1.

10. A reactor for rapid thermal processing equipped with a heating device according to claim 2.

11. A reactor for rapid thermal processing equipped with a heating device according to claim 3.

12. A reactor for rapid thermal processing equipped with a heating device according to claim 4.

13. A reactor for rapid thermal processing equipped with a heating device according to claim 5.

14. A reactor for rapid thermal processing equipped with a heating device according to claim 6.

15. A reactor for rapid thermal processing equipped with a heating device according to claim 7.

16. A reactor for rapid thermal processing equipped with a heating device according to claim 8.

* * * * *